US007835434B2

(12) United States Patent  (10) Patent No.: US 7,835,434 B2
Huynh et al.  (45) Date of Patent: Nov. 16, 2010

(54) ADAPTIVE RADIO FREQUENCY (RF) FILTER

(75) Inventors: Thien Luong Huynh, Epalinges (CH); Anil Gercekci, Bellevue (CH); Anthony David Newton, Le Vaud (CH)

(73) Assignee: Freescale Semiconductor, Inc., Austin, TX (US)

( * ) Notice: Subject to any disclaimer, the term of this patent is extended or adjusted under 35 U.S.C. 154(b) by 1870 days.

(21) Appl. No.: 10/481,845
(22) PCT Filed: May 21, 2002
(86) PCT No.: PCT/EP02/05607

§ 371 (c)(1),
(2), (4) Date: Jul. 15, 2004

(87) PCT Pub. No.: WO03/001670

PCT Pub. Date: Jan. 3, 2003

(65) Prior Publication Data

US 2004/0234001 A1     Nov. 25, 2004

(30) Foreign Application Priority Data

Jun. 20, 2001  (EP) .................................. 01401632

(51) Int. Cl.
*H03H 7/40* (2006.01)
(52) U.S. Cl. ....................... 375/232; 375/236; 375/350; 708/300; 455/67.11
(58) Field of Classification Search ................. 375/229, 375/230, 232, 236, 285, 284, 346, 350; 455/67.11, 455/67.13, 77, 550.1; 708/300
See application file for complete search history.

(56) References Cited

U.S. PATENT DOCUMENTS 5,146,470 A * 9/1992 Fujii et al. ................... 375/350
6,269,165 B1   7/2001 Stott
6,633,894 B1 * 10/2003 Cole .......................... 708/300

FOREIGN PATENT DOCUMENTS

WO   WO 00/28664   5/2000

WO   WO 01/28310 A2   4/2001

OTHER PUBLICATIONS

Khorramabadi et al.., "FA 10.6: Baseband Filters for IS-95 CDMA Receiver Applications Featuring Digital Automatic Frequency Tuning," ISSCC96/Session 10/ Low-Power & Communication Signal Processing/ Paper FA 10.6, 1996 IEEE International Solid-State Circuits Conference, pp. 172, 173 & 439.
PCT International Search Report PCT/EP02/05607.

* cited by examiner

*Primary Examiner*—Dac V Ha

(57) ABSTRACT

The invention relates to an adaptive Radio Frequency (RF) filter (11), which is particularly useful as an RF filter in Wireless Local Area Networks (WLAN's). As greater demands are placed on RF systems, for example in WLAN's in order to increase channel capacity by utilizing available bandwidth, corresponding demands are placed upon performance and tolerance of components used in FR circuits. An adaptive Radio Frequency (RF) filter for filtering first and second RF signals from an OFDM encoded carrier signal is provided, the adaptive RF filter comprises: a low-pass filter (102) configured to filter first and second RF signals, one from another, so as to provide a first RF output signal; the adaptive RF filter being tunable in response to one or more input signals, the at least one input signal being derived from a comparator (37,100), which compares the first RF output signal with a desired value for said first RF output signal, and provides a connection factor for varying a characteristic of the filter (102). An advantage of the invention is that it facilitates filter of two OFDM encoded RF signals, the first typically at 8.1 MHz and the second (unwanted) at 11.9 MHz, from a base-band signal, with a noise floor level of —55 dB or better. Another advantage is that the filter is able to self calibrate and is able to take into account fluctuations which may affect performance, for example thermal drift, and automatically trim its characteristics so as to compensate for these fluctuations.

5 Claims, 8 Drawing Sheets

ADAPTIVE RADIO FREQUENCY (RF) FILTER

FIELD OF THE INVENTION

The present invention relates to an adaptive Radio Frequency (RF) filter, and more particularly, but not exclusively, to an adaptive RF filter for use in Wireless Local Area Network (WLAN) transmitters, receivers and transceivers.

BACKGROUND OF THE INVENTION

RF filters are employed in RF circuits and devices to filter particular bands of frequencies and/or to remove unwanted or spurious noise. As greater demands are placed on RF systems, for example in WLAN's, in order to increase channel capacity by utilizing available bandwidth, corresponding demands are placed upon performance and tolerance of components used in the RF circuits.

HIPERLAN 2 is an example of a standard that has been developed in order to increase channel capacity. HIPERLAN 2 is a Wireless Local Area Network (WLAN) protocol, based on, and incorporating an Orthogonal Frequency Division Multiplexing (OFDM) scheme.

An advantage of using an OFDM scheme for transmitting RF signals is that it is possible to transmit more data for a given channel bandwidth than was previously possible. The following modulation formats may be incorporated in the HIPERLAN 2 scheme: Binary Phase Shift Keying (BPSK); Quadrature Phase Shift Keying (QPSK); Quadrature Amplitude Modulation (16 QAM) and 64 QAM. The flexibility of use of the aforementioned modulation techniques means that data rates of between 6 to 54 Mbit/s can be transmitted.

A particular advantage of the HIPERLAN 2 scheme, is that systems incorporating it may be used in offices, shops, airports or in similar environments, which were previously prone to multipath dispersion. This is because RF transmissions which use HIPERLAN 2 are reflection resistant.

Typically HIPERLAN 2 operates at 5.5 GHz with multiple channels; each channel has 52 active sub-carriers within a 20 MHz bandwidth. Eight HIPERLAN 2 channels are shown in diagrammatical form in FIG. 3. OFDM modulation schemes require two component signals to be in phase quadrature. The two component signals are referred to as the I and Q signals. During operation, and following down conversion to a baseband signal, the base-band signal of interest has two 10 MHz side bands, at which sub-carrier frequencies, the I and Q component signals lie.

However, because only a relatively small frequency band separates adjacent sub-carrier channels, even small changes in filter characteristics can cause variations in overall filter behaviour, with the result that small variations in filter characteristics (for example as a result of thermal drift) give rise to cross-talk interference between adjacent sub-carriers. Typically a change in overall absolute tolerance of ±16% of the passive components' value prevents the filter from achieving the required of −27 dB stop band performance. FIG. 3 shows how sub-carriers are separated from a channel. FIG. 4 illustrates diagrammatically how close together the sub-carrier channels are one to another.

It would therefore be advantageous to be able to adjust the roll-off characteristics of two analog low-pass filters so as to meet the performance requirements specified in HIPERLAN 2.

SUMMARY OF THE INVENTION

According to a first aspect of the present invention there is provided an adaptive Radio Frequency (RF) filter arrangement for filtering first and second RF signals from an OFDM encoded carrier signal, the adaptive RF filter arrangement comprising: a low-pass filter means configured to filter first and second RF signals, one from another, so as to provide a first RF output signal; the adaptive RF filter arrangement being tunable in response to at least one input signal, the at least one input signal being derived from a comparator, which compares the first RF output signal with a desired value for said first RF output signal and provides a correction factor for varying a characteristic of the filter arrangement.

First and second RF signals are preferably adjacent sub-carriers within a channel. Prior to filtering the sub-carrier are preferably down-converted to baseband signals. The down conversion of signals has the advantage that lower sampling rates may be used. Filtering of base-band signals may be achieved by attenuating channel stop bands by 27 dB at a frequency of 11.875 MHz.

The RF filter arrangement is preferably tuned by varying one or more capacitive elements. The capacitive elements may be arranged in a parallel network. However, alternative variables may be modified, including without limitation: the resistance of one or more components of the filter or the transconductance (gm) of one or more transistor(s) in an operational amplifier used in the filter.

HIPERLAN 2 (and its US counterpart standard IEEE802.11A) is a relatively new standard. There is no arrangement that performs a matching of two filters to the Wireless LAN requirements using signals generated by an OFDM modem. In particular, no techniques exist for carrying out timing using a hybrid analog and digital system. In particular, no techniques exist for carrying out any timing using a hybrid analog and digital system.

Preferably a plurality of capacitative elements are connected in a parallel configuration and at least two of said capacitive elements are arranged to be switched simultaneously so as to maintain a substantially constant quality factor (Q factor) to the desired frequency.

In one embodiment, the adaptive Radio Frequency (RF) filter arrangement is adapted to vary its frequency response. in accordance with a command signal which is provided by a digital controller. Means are provided for filtering a first base-band signal from a second base-band signal, both signals being OFDM encoded signals. A band-pass filter has first and second outputs, the outputs providing separate signals to respective first and second mixers: A feedback signal is used to derive a signal offset value, whereby, in use, the signal offset value is used to modify the filter thereby tuning the first signal from the second signal.

Preferably any ripple which may be present in the band-pass filter (0→8.125 MHz) is limited to a maximum value of 1 dB.

In order to allow the re-construction of I and Q components, first and second filters need to exhibit good matching. That is they need to be within ±0.2% of one another.

Preferably the adaptive (RF) filter arrangement includes: two low pass filters for 1 and Q signal components, variable capacitors adapted to modify said low pass filters, means for modifying an OFDM modem to generate and measure response to a training signal; means for generating a calibration signal under control of a controller; and a signal path so that the calibration signal can be applied to the or each filter.

Advantageously an OFDM digital modem of a wireless LAN (WLAN) system measures a single filter response to a signal, the signal comprises a plurality of sinusoidal signals, and a controller modifies or hold the frequency response of the other filter(s); the assumption being made that the other filter(s) have identical characteristics.

Calibration is advantageously performed during an initial power-up phase of a WLAN system incorporating the present invention. Alternatively calibration may be performed when the filter is operational, for example when it is networked with other devices.

Preferably a reference input signal, which may be derived from a ROM look-up table, provides a sample of at least one test signal waveform.

The filter response is performed on a single filter output and identical control is applied to each filter simultaneously. The input voltage dynamic range is typically 2 volts peak-to-peak.

Two frequencies are advantageously used to calibrate the filter. The signals are manipulated by Fast Fourier Transforms (FFT), as these are readily available. It will be appreciated that more than two frequencies may be used.

Advantageously feedback signals are used to calibrate the filter. Stepwise changes are may be achieved using digital feedback signals. An overshoot capability may be incorporated into a control algorithm so as to permit application of a reverse stepwise increment (decrement), in order to optimise tuning.

Calibration includes the function of recalibration. Recalibration may be required during operation as a result of, for example, thermal drift.

In a particularly preferred embodiment two filters are configured so that they are multiplexed in transmit or receive modes, thereby exploiting a feature of HIPERLAN 2 scheme, namely that it operates in half-duplex mode. That is, information is transmitted in one direction at a time. However, this applies to other standard implementations where transmit and receive path filters are independent.

A preferred embodiment of the Invention will now be described, by way of exemplary example only, with reference to the Figures in which:

BRIEF DESCRIPTION OF FIGURES

FIG. 1 is a functional block diagram of a known OFDM transceiver system;

FIG. 2 is a detailed block diagram of the transceiver of FIG. 1, showing adaptive low pass filters.

FIG. 3 shows a series of graphs which illustrate diagrammatically various stages of tuning a single sub-carrier channel from several OFDM (HIPERLAN 2) channels;

FIG. 4 is a graph of frequency against attenuation and depicts, diagrammatically, two adjacent sub-carrier channels;

DETAILED DESCRIPTION OF A PREFERRED EMBODIMENT OF THE INVENTION

Figure 1:
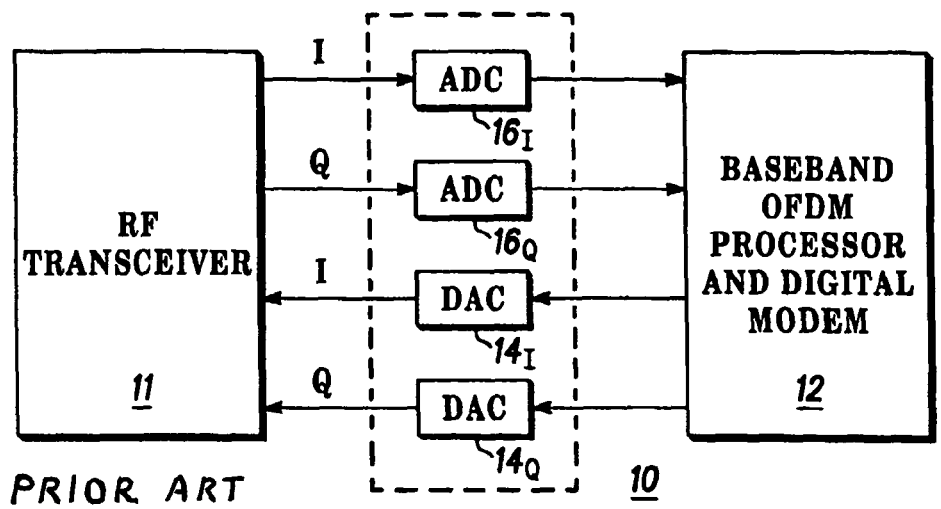
FIGS. 1 to 4 assist in understanding the Invention
Figure 3:
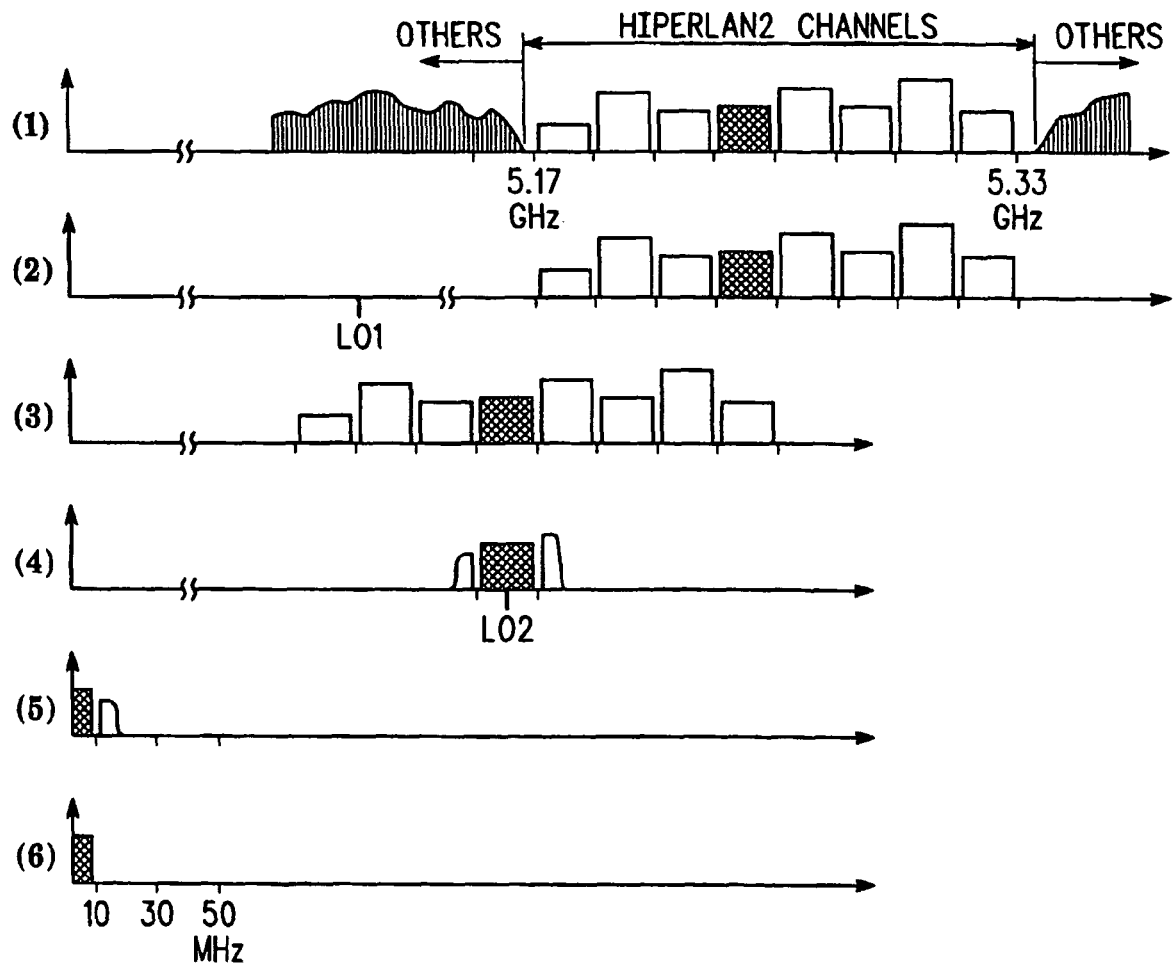
Figure 2:
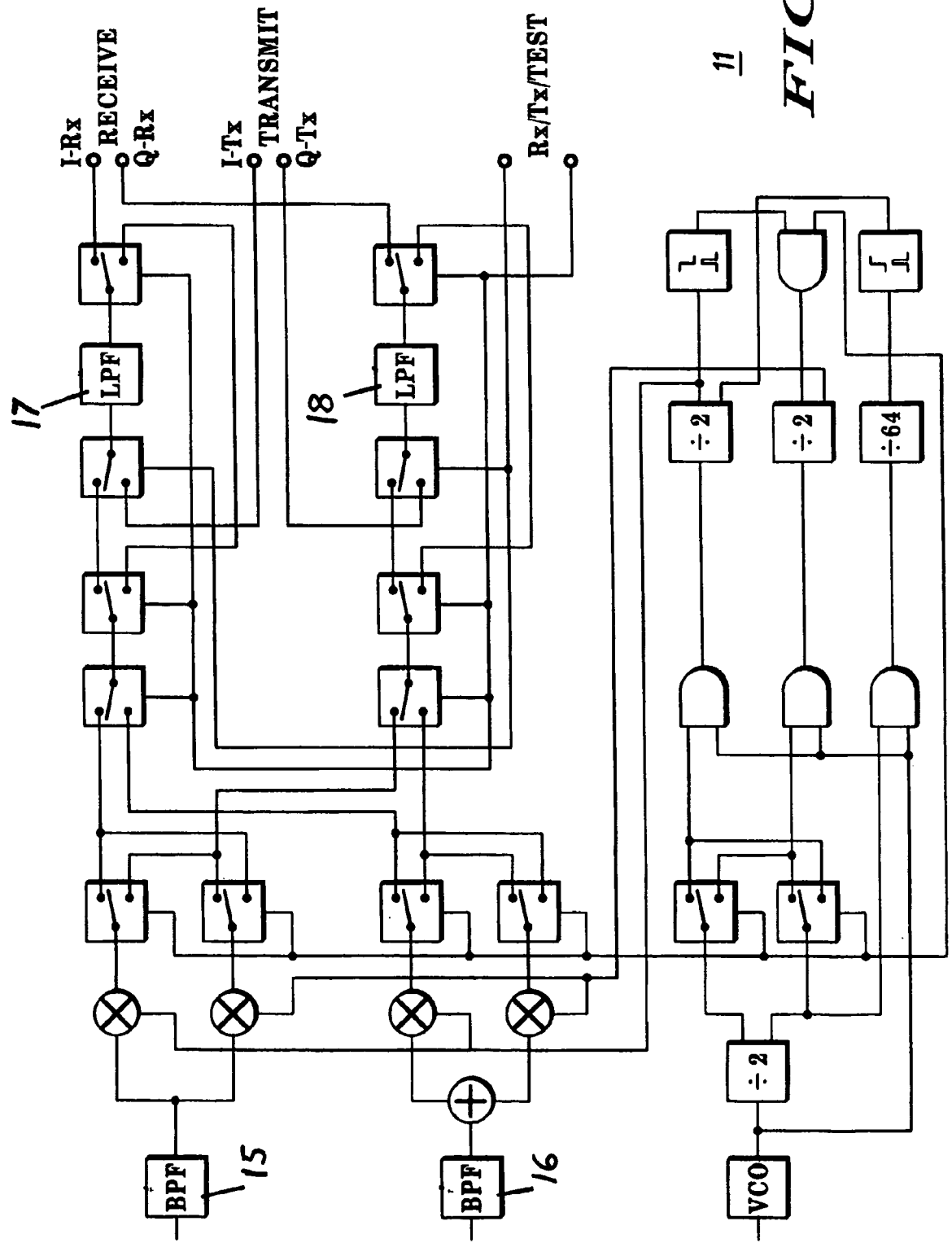
Figure 4:
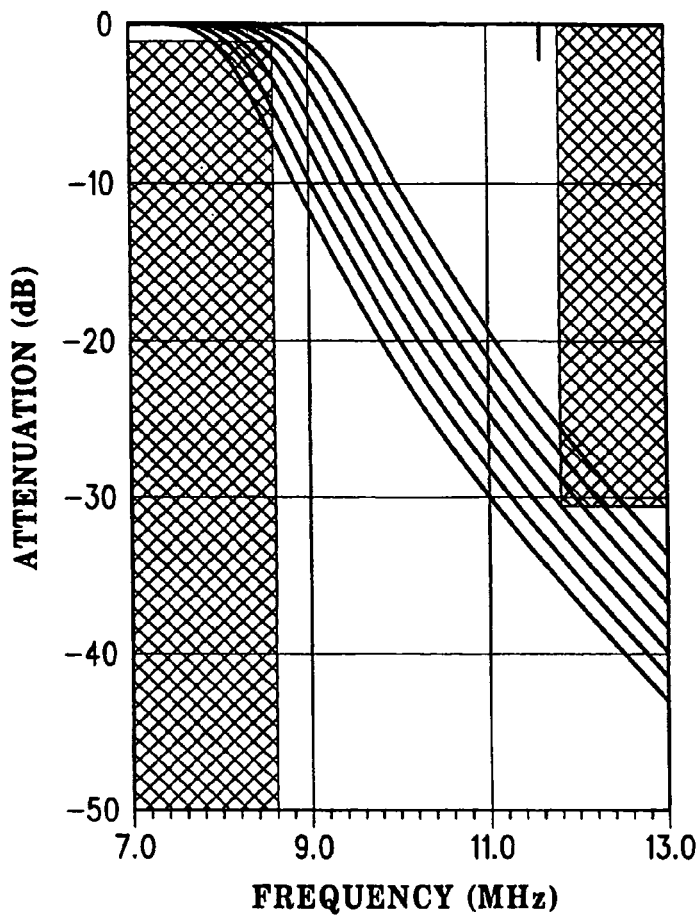

Referring generally to the Figures, and particularly FIG. 1, there is shown diagrammatically a functional block diagram of an OFDM system 10. The system includes an RF transceiver 11 and a base band OFDM processor and modem 12. Communication between the transceiver 11, processor and modem 12 is by way of Digital-to-Analog Converters (DAC) 14, and Analog-to-Digital Converters (ADC) 16. Respective I and Q signals each have separate channels 141 and 14Q in the DAC's 14 and 161 and 16Q in the ADC's. FIG. 2 shows in more detail a block diagram of transceiver 11. Transceiver 11 includes four filters 15, 16, 17 and 18. Filters 15 and 16 are band pass filters. Filters 17 and 18 are low pass filters. Each filter 15 to 18 is a 7th order Tchebychev filter and comprises a cascaded configuration of three second order, and one first order, low pass filter sections.

Figure 5:
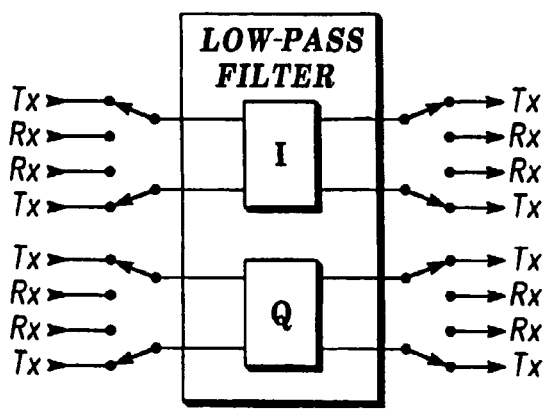
FIG. 5 is a block diagram of adaptive filters in accordance with the invention.

The quality factors (Q factors) of the second order filters are: 5.45, 1.63 and 0.778. Detailed diagrams of the filters are shown in FIG. 5. To achieve dynamic handling, and to obtain a good signal to noise ratio (SNR), the cascaded configuration of the filters is: 1st order–2nd order (Q=1.63)–2nd order (Q=0.778)–2nd order (Q=5.45).

Figure 6:
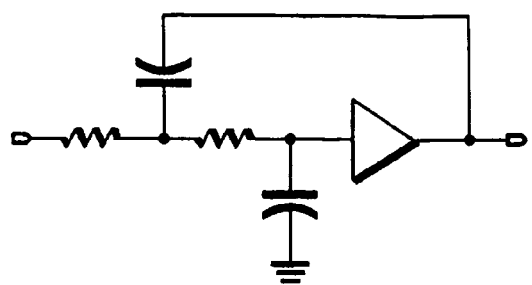
FIGS. 6 and 7 are circuit diagrams showing Sallen and Key configuration used in the adaptive filters of FIG. 5.
Figure 7:
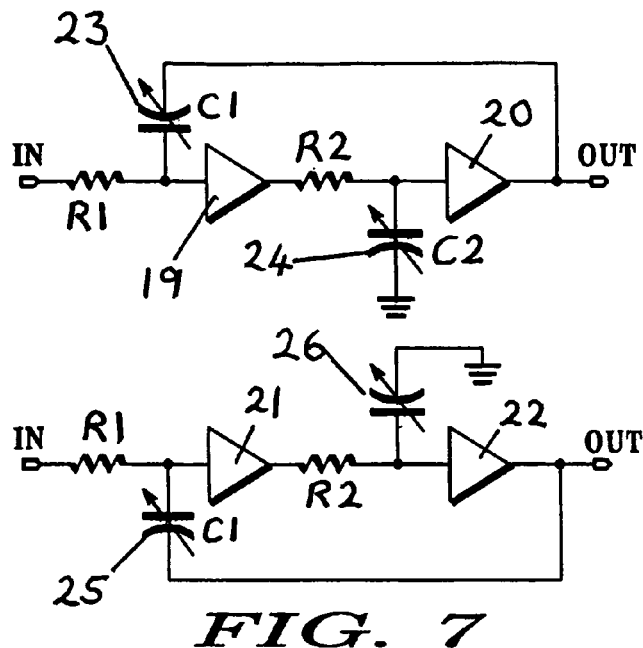

As the quality factors are not very high, the so-called Sallen and Key structure is used as shown in FIGS. 6 and 7. Use of these components helps to keep down the costs of the device. The Sallen and Key structure has other advantages when applied to the present invention. For example at low frequencies filter matching depends on the passive components ratio matching, which is generally very good; and on the gain of unit gain amplifiers (or follower amplifiers) 19-22. Follower amplifiers 19,21 ensure a gain parameter of around 0.996 in the pass band. Another advantage is the large input signal dynamic that the follower amplifier 19,21 are able to support. The flexibility of the cascaded configuration therefore allows balancing of signals at the output of each 2nd order section.

To overcome this problem, an up-down counter 100 (See FIG. 10) is used to vary the capacitance of the filters. Based on the output response of an end pass band (frequency=8.125 MHz) sinusoid signals are injected at the input, the Fast Fourier Transformation (FFT) spectrum analysis in the OFDM digital modem part governs the up/down control signal to adjust the capacitors 23-26 (see FIG. 7).

The following section describes each component of the filter.

Figure 8:
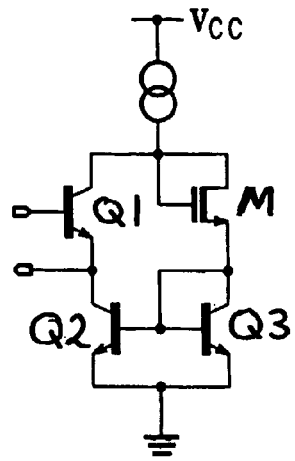
FIG. 8 is a circuit diagram of a follower amplifier.

First, the Sallen and Key structure shown in FIG. 7 requires passive component ratios (R1/R2 and C1/C2) to be proportional to the square of the quality factor Q. By including a unity gain amplifier between the two RC circuits, (thereby effectively 'splitting' them), the Q factor is proportional to the ratio of the passive components. The circuit is shown in FIG. 8 and depicts a symmetrical filter with ground as common mode node. The sensitivity of Q to the gain (K) of a follower amplifier of such a structure is proportional to the square of Q.

Typically if Q=5.45 and K=0.9, then ΔQ/Q=(5.45^2)*(1−0.9)=3 which is approximately 9.5 dB.

FIG. 8 shows follower amplifier. Usually, transistor Q1 is used without Q2 and Q3 and produces an error, from the input signal, inversely proportional to the product of the transistor transconductance (gm), and the impedance seen at the emitter of the transistor. Transistors Q2 and Q3, improve the gm 10 times, reducing the error 10 orders of magnitude. The gain (K) obtained is 0.996→0.998.

Q1 of the follower amplifier shifts DC input voltage one VBE down, causing a loss of 1V at minus 40° C. and reduces the dynamic of the filter. NMOS transistor M is used to prevent saturation of Q1. The relevance of this is explained below.

Figure 9:
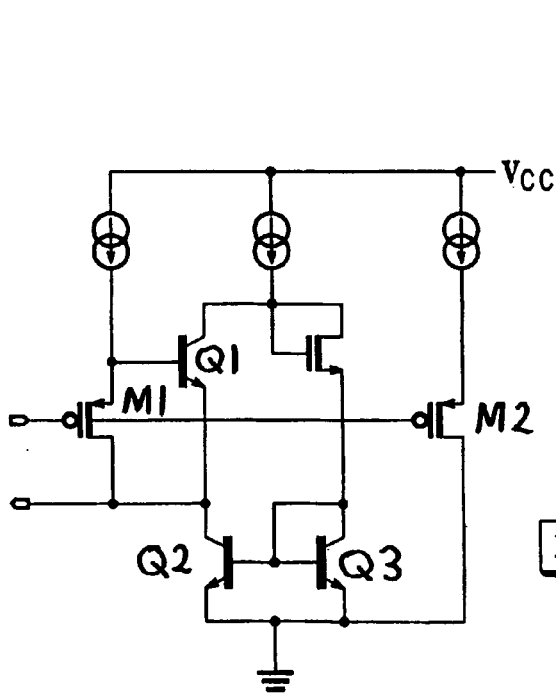
FIG. 9 is a circuit diagram of a follower amplifier used in cascading the filters shown in FIG. 5.

To allow the cascading of four sections, a DC voltage shift is necessary and is achieved by the follower of FIG. 9. Two supplementary PMOS transistors M1 and M2 are required. There are two outputs: the first one is taken at the Q1 emitter which is used to drive feedback capacitor C1, the second is connected to the source of transistor M2 and is used to drive the section of the filter. This realizes a DC voltage shift up. PMOS transistors M1 and M2 vary positively with temperature, whereas NPN bipolar transistors vary negatively. All current sources are arranged in such a way that their temperature coefficients compensate the VBE of the first follower amplifier. Gates of M1 and M2 are connected together and connected to output of the second R2C2 network shown in FIG. 7.

As mentioned above, C1 and C2 are used to tune the cut-off frequency of filters. The quality factor Q is function of the ratio C1/C2. In order to keep the ratio constant, C1 and C2 must vary simultaneously with the same adjustment for the same frequency shift. The way this is achieved is described below.

Figure 10:
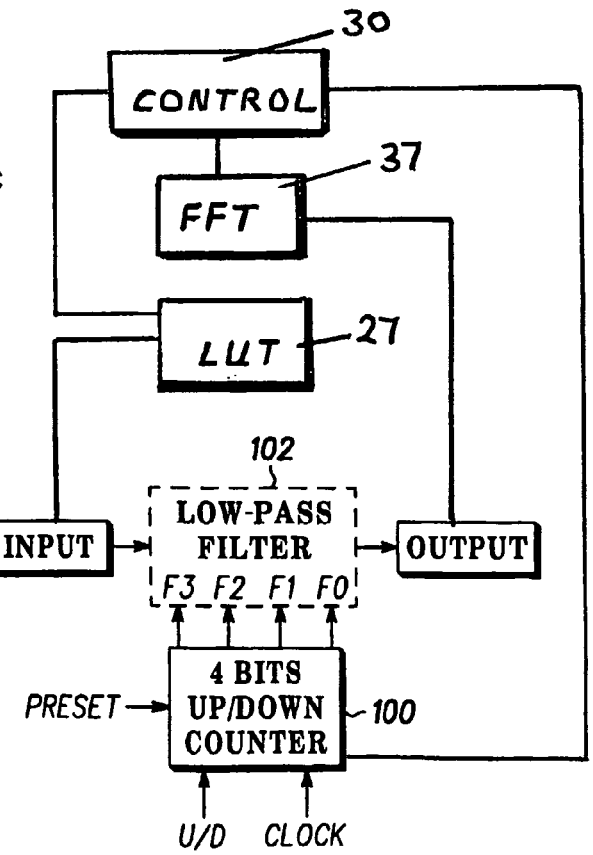
FIG. 10 is a block diagram of an adaptive filter.
Figure 11:
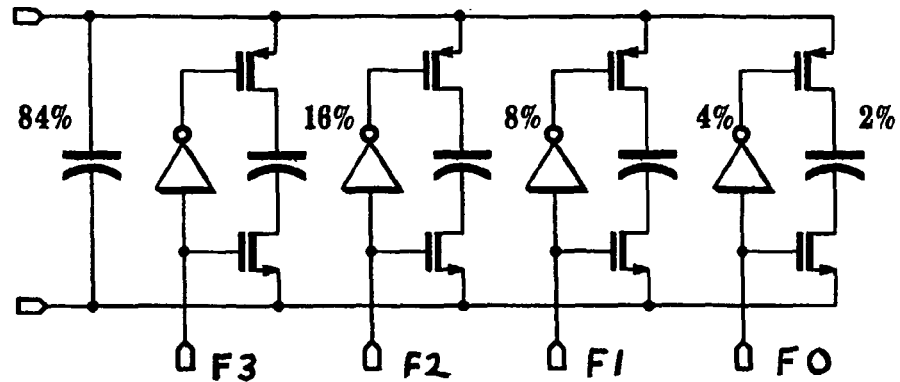
FIG. 11 is a circuit diagram of the filter in FIG. 10 and shows input channels F0-F3, from up/down counter, connected to four variable capacitive networks.
Figure 14:
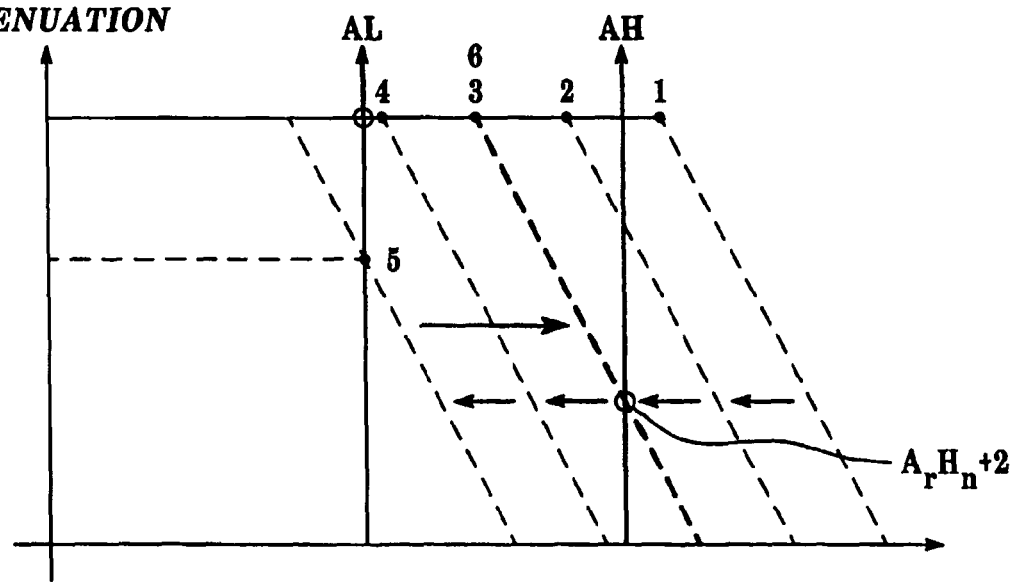
FIG. 14 illustrates the principle of tuning of filter characteristics.

Four bits are provided by digital counter 100 (See FIGS. 10 and 11). The least significant bit (LSB) is equivalent to a change in capacitive value of 2%. A diagrammatical implementation of this is shown in FIG. 10. By varying the frequency in this manner, four steps are allowed between one end of a pass-band (at 8.125 MHz) and the beginning of the stop-band (at 11.875 MHz) as depicted in FIG. 14. The control range is therefore ±16%.

Figure 12:
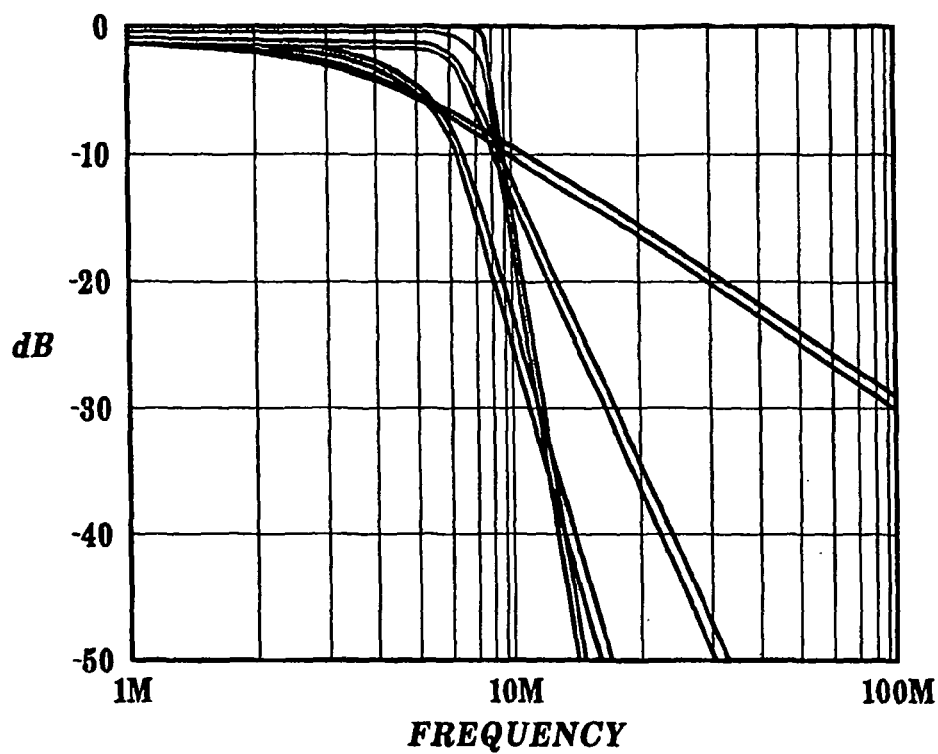
FIGS. 12 and 13 are graphs showing respectively, theoretical and actual response characteristics of the filters of FIG. 5.
Figure 13:
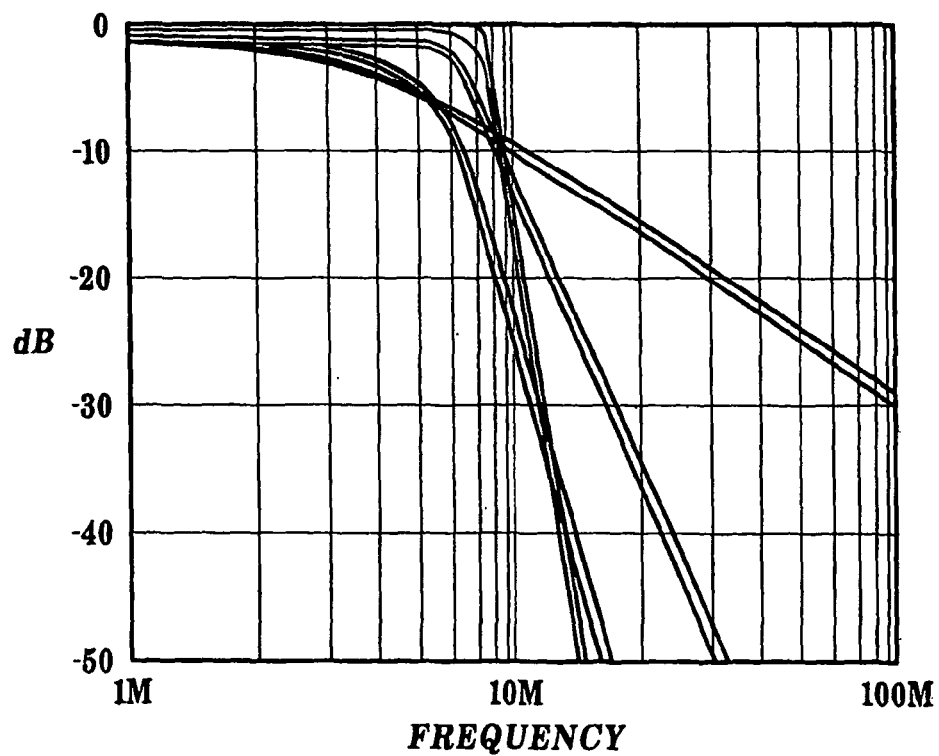

FIG. 12 shows examples of the frequency response characteristics of the filter with 8.125 MHz cut-off frequency. Simulated theoretical (ideal R, C and Unit Gain VCVS) and real responses of each section and of the adaptive filter are shown in FIG. 13. Thus the prediction that the tuning can satisfy the specifications is confirmed.

Figure 17:
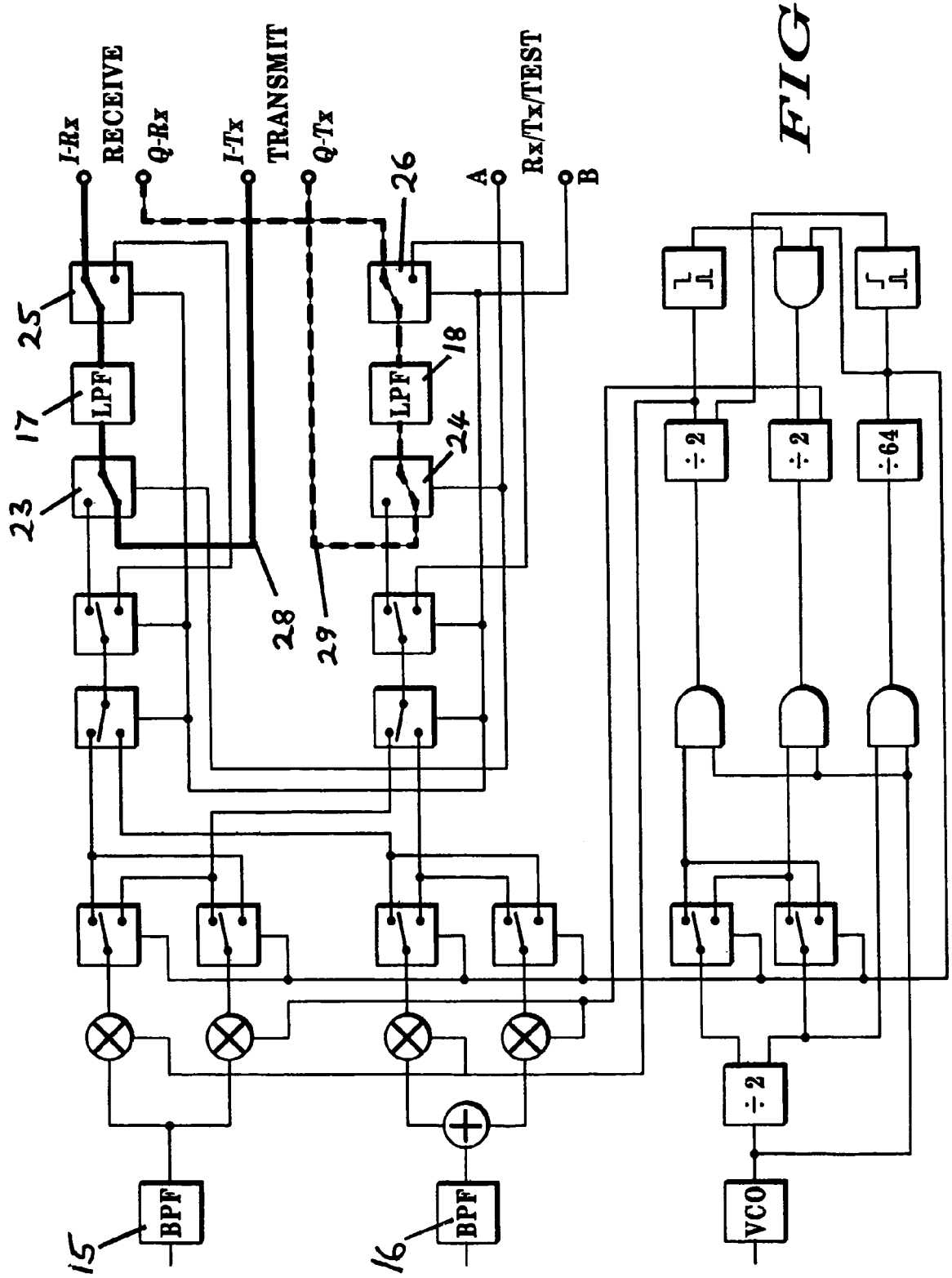
FIG. 17 is a circuit diagram of a transceiver including filters in accordance with the invention.

The transceiver will now be described in operational mode. In FIG. 17, multiplexers 23-26 are switched to calibrate filters 17 and 18. A basic assumption is made here: the characteristics of the filters 17, 18 are matched. This means that measurement made on one filter is applicable to the other, hence any correction(s) made to one filter is/are made on the other filter. This removes the requirement to measure the characteristics of the other filter(s).

A calibration input reference signal is issued to the circuit under calibration. The waveform of this signal consists of a sum of two sinusoidal signals (AL and AH) of known amplitude but different frequencies where the filter response to the first signal (ArL) should have no attenuation since (AL) has the frequency of the last active sub carrier carrying information in the OFDM symbol. The signal therefore is not affected by any roll off of the filter, once calibrated appropriately. The second received signal (ArH) is in the desired roll-off region of the filter where attenuation is high. The rate of change of attenuation with frequency is also important. Signal AH is chosen to be the frequency of the sub carrier with the highest frequency (K=32) in the OFDM symbol previously presented to the filter. In normal data transfer, in the case of HIPERLAN 2, this is one of the null carriers carrying no data information. It corresponds practically to the mid position between active sub carriers in between two adjacent bands.

A reference signal may be generated using a ROM look-up table 27 whose contents describe the waveform of the desired time domain signal when the contents are read out at the suitable speed. This ensures desired precision of the generated signal is in the same order as the precision of the master clock of the system i.e.: the quartz oscillator (not shown).

The reference signal is converted to analog via the DAC. During the calibration mode it is then applied to the filter under measurement via the multiplexers 23-26 to training signal paths 28,29, as shown in FIG. 17, whilst contemporaneously disconnecting signals from a radio transmit or receive path.

Figure 15:
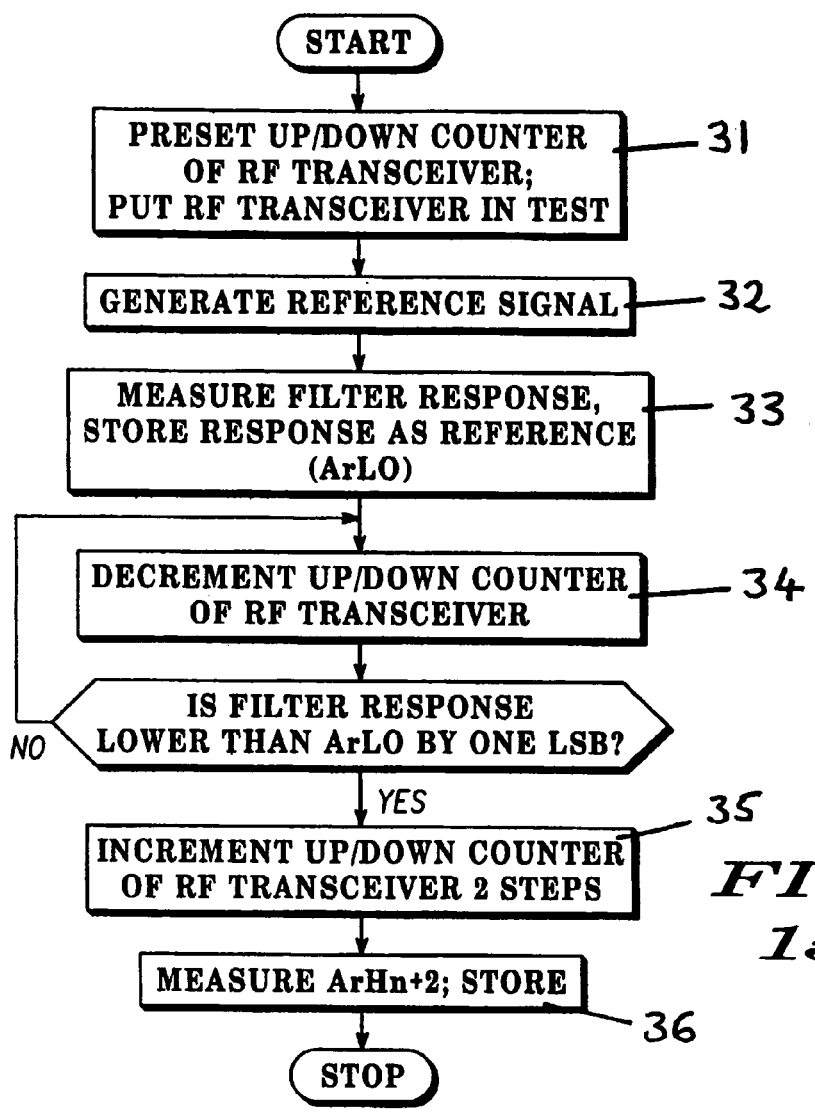
FIG. 15 is a flow diagram showing key steps in the decision and implementation of the tuning stages shown in FIG. 14.

Other signals are: preset signal, clock signal, an UP/DOWN control signal and an OUTPUT signal from each filter. The filters are capable of changing their cut-off frequencies as described above by means of digital controller 30. Referring to FIGS. 14 and 15;

Initially, counter 100 is preset (step 31) to maximum value and a reference INPUT signal is applied to filter 102 (FIG. 10). The response of the filter (step 33) is analysed by Fast Fourier Transformer (FFT) 3 after digitising the analogue signal (step 33) suitably by ADC of sufficient dynamic range. Amplitudes of received sinusoidal signals (ArL0 & ArH0), corresponding to the calibration waveform (AL & AH) at the input of the filter, are stored in memory and serve as "reference" amplitudes for subsequent measurements. Counter 100 is decremented by ONE (step 34). This changes the frequency cut-off characteristics of filter 102 and the response of the filter to the same input reference signal (AL+AH). A new measurement is made after applying an input reference signal.

If the magnitude of (ArL2) is within 1 Least Significant Bit (LSB) of the original (ArL0) amplitude of the "reference" signal, a down count is generated. The process is then repeated until the difference of (ArLn) and the initial (ArL0) is greater than 1 LSB.

When this situation occurs, the digital part counts UP TWO steps (step 35), measures (step 36) the response of the filter 102 at this new value and memorises the values for (ArLn+2) and (ArHn+2).

Initial calibration may take multiple steps until desired filter roll-off characteristics are obtained. Typically starting just after receipt of carrier (AL). Since the FFT (37) has a finite calculation speed, this may take time that is not in line with such a procedure to be done in line during an established WLAN session when a link is in place. However, for many reasons, particularly due to temperature drift, an incremental calibration may be required. This can be achieved when the WLAN system is in operation, however protocol is such that, time slots are available when the transceiver is neither transmitting nor receiving. Two OFDM symbol time frames are sufficient to make such measurement and decision. (i.e.: 8 microseconds). Hence incremental calibration may be achieved without disturbing data flow.

In the case of HIPERLAN 2, the most suitable instance is the Random Access Channel (RCH) time period that is a reserved time in each 2 millisecond time frame. Typically the minimum RCH time slot is 9 microseconds. Since the modifications of the characteristics of the filter are incremental, the calibration process in such a case can be made incremental in order not to exceed the available time slot in RCH.

Figure 16:
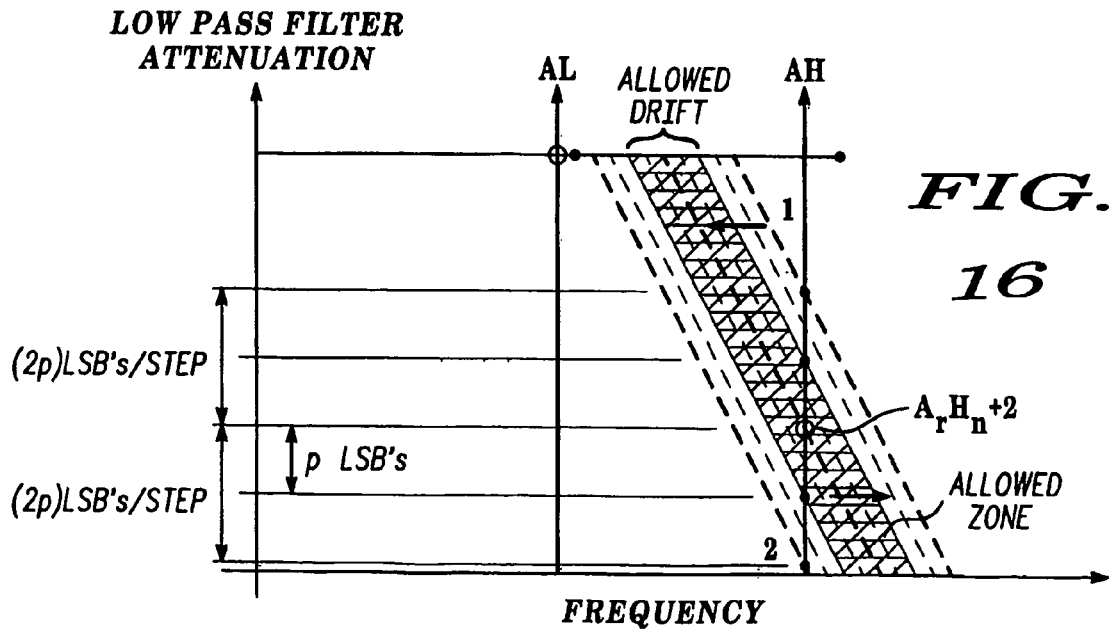
FIG. 16 illustrates diagrammatically the principle of calibration of filters to compensate for drift.

At first, the response to the reference signal (AL+AH) is measured after a possible drift. In this calibration, (see FIG. 16) only the high frequency component of the reference signal is exploited (AriH). If this is greater than δ LSB's ABOVE (ArHn+2), which is the stored value after the initial calibration, then the counter is DECREMENTED by ONE. This is due to a drift that made the filter cut-off drift towards higher frequencies. If (AriH) is less than δ LSB's BELOW (ArHn+2), then the up/down counter controlling the response of the filter is INCREMENTED by ONE. This is due to a filter that has drifted the cut-off frequency to lower frequencies. Ideally δ is chosen such that the amplitude difference between two counter steps for the same input frequency can be described in 2δ LSB's (least significant bits) of the output of the ADC. 2δ is the smallest change in attenuation for ArH as one changes the steps to adjust the filter roll-off.

A digital controller (30) implements control as to how many measurement/correction loops are required. In so doing, the digital controller determines the amount of time to be spent in calibration, compared with the amount of time the system has to undertake the calibration.

Hence if insufficient time is available in one WLAN time frame, then drift adjustment can be done spread over multiple time frames, one step at a time. Control and implementation decisions may be carried out under software control from a link controller (not shown).

The invention claimed is:

1. An adaptive filter arrangement for filtering first and second sub-carriers from an OFDM encoded carrier signal, the adaptive filter comprising:
   a low-pass filter configured means to filter first and second sub-carriers, one from another, so as to provide a first output signal, and variable capacitors adapted to modify said low pass filter configured means; and
   the adaptive filter arrangement comprising:
   an OFDM encoder for generating a calibration signal under control of a controller;
   a signal path so that the calibration signal can be applied to the low-pass filter configured means;
   Fast Fourier Transform means for measuring a response of the first output signal to the calibration signal; and
   wherein the adaptive filter arrangement is tunable in response to one or more input signals derived from a comparator operable to compare the response of the first output signal to the calibration signal with a desired value, and in response to provide a correction factor for varying a characteristic of the filter.

2. The adaptive filter arrangement according to claim 1 wherein the correction factor varies at least one capacitive element.

3. The adaptive filter arrangement according to claim 1 and including two low-pass filters for filtering first and second components from a base-band RF signal.

4. A method of calibrating an adaptive filter arrangement including the steps of:
   pre-setting an up/down counter;
   generating a reference signal in an OFDM encoder;
   measuring and storing a filter response corresponding to the reference signal, the measuring including a Fast Fourier Transform;
   decrementing or incrementing the up/down counter;
   comparing the measured filter response with a desired value; and
   varying a capacitance value depending upon the comparison, thereby varying the filter response.

5. The method according to claim 4 in which the reference signal is applied to a filter via a training path whilst decoupling a transmit and receive path.

* * * * *